United States Patent [19]

Le Cornec et al.

[11] Patent Number: 5,719,511
[45] Date of Patent: Feb. 17, 1998

[54] CIRCUIT FOR GENERATING AN OUTPUT SIGNAL SYNCHRONIZED TO AN INPUT SIGNAL

[75] Inventors: Yann Le Cornec; Alain Doreau, both of Fremont, Calif.

[73] Assignee: Sigma Designs, Inc., Fremont, Calif.

[21] Appl. No.: 593,325

[22] Filed: Jan. 31, 1996

[51] Int. Cl.[6] ............................................. H03L 7/00
[52] U.S. Cl. ..................... 327/146; 327/161; 375/362; 348/537; 348/540
[58] Field of Search ............................. 327/141, 144, 327/145, 146, 161, 162, 163; 375/354, 355, 362, 363, 364, 365; 348/512, 513, 516, 521–524, 540, 541, 537

[56] References Cited

U.S. PATENT DOCUMENTS

| | | | |
|---|---|---|---|
| 3,846,762 | 11/1974 | Gregory et al. | 341/126 |
| 3,947,826 | 3/1976 | Bockwoldt | 348/441 |
| 4,353,057 | 10/1982 | Bernet et al. | 341/136 |
| 4,394,650 | 7/1983 | Long et al. | 345/23 |
| 4,425,581 | 1/1984 | Schweppe et al. | 348/510 |
| 4,528,561 | 7/1985 | Kitamura | 345/195 |
| 4,587,633 | 5/1986 | Wang et al. | 364/514 C |
| 4,628,479 | 12/1986 | Borg et al. | 395/479 |
| 4,675,612 | 6/1987 | Adams et al. | 327/142 |
| 4,684,936 | 8/1987 | Brown et al. | 345/116 |
| 4,713,621 | 12/1987 | Nakamura et al. | 327/152 |
| 4,757,310 | 7/1988 | Katsura et al. | 345/28 |
| 4,779,210 | 10/1988 | Katsura et al. | 395/134 |
| 4,811,205 | 3/1989 | Normington et al. | 395/502 |
| 4,814,879 | 3/1989 | McNeely | 348/537 |
| 4,862,392 | 8/1989 | Steiner | 395/127 |
| 4,870,406 | 9/1989 | Gupta et al. | 345/199 |
| 4,876,600 | 10/1989 | Pietzsch et al. | 348/588 |
| 4,905,189 | 2/1990 | Brunolli | 395/501 |
| 4,916,301 | 4/1990 | Mansfield et al. | 345/133 |
| 4,947,257 | 8/1990 | Fernandez et al. | 348/585 |
| 4,947,342 | 8/1990 | Katsura et al. | 395/136 |
| 4,953,101 | 8/1990 | Kelleher et al. | 395/505 |
| 4,994,912 | 2/1991 | Lumelsky et al. | 348/441 |
| 5,046,023 | 9/1991 | Katsura et al. | 395/134 |
| 5,065,346 | 11/1991 | Kawai et al. | 395/128 |
| 5,097,257 | 3/1992 | Clough et al. | 345/132 |
| 5,111,292 | 5/1992 | Kuriacose et al. | 348/384 |
| 5,111,409 | 5/1992 | Gasper et al. | 434/307 R |
| 5,122,875 | 6/1992 | Raychaudhuri et al. | 348/390 |
| 5,138,307 | 8/1992 | Tatsumi | 345/121 |
| 5,151,875 | 9/1992 | Sato | 364/784 |
| 5,157,716 | 10/1992 | Naddor et al. | 379/92 |
| 5,168,356 | 12/1992 | Acampora et al. | 348/409 |
| 5,191,410 | 3/1993 | McCalley et al. | 348/13 |
| 5,191,548 | 3/1993 | Balkanski et al. | 364/725 |

(List continued on next page.)

FOREIGN PATENT DOCUMENTS 0 384 257  8/1990  European Pat. Off. .
0 384 419  8/1990  European Pat. Off. .

OTHER PUBLICATIONS

Brunhoff, Todd; "VEX Provides Mechanism for Integrating Graphics and Video"; Computer Technology Review; 10 Nov. 1990; No. 1, pp. 107–111.

*Primary Examiner*—Timothy P. Callahan
*Assistant Examiner*—Kenneth B. Wells
*Attorney, Agent, or Firm*—D'Alessandro & Ritchie

[57] ABSTRACT

A method and system for synchronizing to an incoming Hsync signal, and for generating a phase locked clock signal in response thereto. The Hsync signal and an incoming clock are coupled to a sequence of modules. Each module includes a latch for sampling the incoming clock on a transition of the Hsync signal, whose output is combined (using an XOR gate) with the Hsync signal. Each module includes a time delay for generating a delayed clock signal, incrementally delayed from the previous module in the sequence, so that the clock signal for each module is phase-offset from all other modules. The latch outputs are summed using a resistor network, to produce a triangle-shaped waveform which is phase locked to the Hsync signal and which is frequency locked to the incoming clock. The triangle-shaped waveform is compared with a constant voltage to produce a square wave.

27 Claims, 4 Drawing Sheets

U.S. PATENT DOCUMENTS

| | | | |
|---|---|---|---|
| 5,196,946 | 3/1993 | Balkanski et al. | 358/433 |
| 5,208,745 | 5/1993 | Quentin et al. | 364/188 |
| 5,220,312 | 6/1993 | Lumelsky et al. | 345/190 |
| 5,231,492 | 7/1993 | Dangi et al. | 348/17 |
| 5,253,078 | 10/1993 | Balkanski et al. | 358/426 |
| 5,270,832 | 12/1993 | Balkanski et al. | 358/432 |
| 5,289,276 | 2/1994 | Siracusa et al. | 348/469 |
| 5,309,111 | 5/1994 | McNeely et al. | 327/7 |
| 5,309,567 | 5/1994 | Mizukami | 395/325 |
| 5,329,630 | 7/1994 | Baldwin | 395/425 |
| 5,333,261 | 7/1994 | Guttag et al. | 395/162 |
| 5,341,318 | 8/1994 | Balkanski et al. | 364/725 |
| 5,371,861 | 12/1994 | Keener et al. | 395/309 |
| 5,379,356 | 1/1995 | Purcell et al. | 382/56 |
| 5,397,853 | 3/1995 | Koguchi | 84/609 |
| 5,402,147 | 3/1995 | Chen et al. | 345/115 |
| 5,406,306 | 4/1995 | Siann et al. | 345/115 |
| 5,434,913 | 7/1995 | Tung et al. | 379/202 |
| 5,446,501 | 8/1995 | Takemoto et al. | 348/620 |
| 5,450,542 | 9/1995 | Lehman et al. | 395/162 |
| 5,450,544 | 9/1995 | Dixon et al. | 395/164 |
| 5,471,576 | 11/1995 | Yee | 395/154 |

CIRCUIT FOR GENERATING AN OUTPUT SIGNAL SYNCHRONIZED TO AN INPUT SIGNAL

BACKGROUND OF THE INVENTION

1. Field of the Invention

This invention relates to synchronizing and clock generating circuits, and methods for using the same.

2. Description of Related Art

In computer systems and other digital systems for displaying video signals, it is common to receive an incoming video signal and to synchronize to its timing. The incoming video signal typically includes a horizontal sync (Hsync) signal, a periodic signal having a period of one horizontal line of video, and having a clock edge in phase with a beginning point for each such horizontal line.

It is generally desirable to synchronize other higher frequency signals to the Hsync signal, such as a pixel clock (Pclock) signal. The Pclock frequency is typically 2000 times the Hsync frequency. This is often accomplished with a phase locked loop. However, use of a phase locked loop is subject to a substantial drawback. The Hsync signal may not be precise, and its frequency may vary over time, causing other higher frequency signals such as the Pclock signal to have a significant jitter, making it substantially unusable for graphics applications, for example. Because higher frequency signals are a substantial multiple of the Hsync frequency, resulting variation in those signals can be substantial and is undesirable.

Accordingly, it would be advantageous to provide a circuit for synchronizing and for generating a clock signal.

SUMMARY OF THE INVENTION

The invention provides a method and circuit for synchronizing to an incoming Hsync signal or other incoming signal, and for generating a phase locked clock signal or other high frequency signal in response thereto. A set of parallel clock signals are sampled by the Hsync signal, to produce a set of sample clock bits. The sample clock bits are logically combined with the Hsync signal and summed, to produce a summed signal which is phase locked to the Hsync signal and has the same period as the clock signals. In a preferred embodiment, the summed signal is compared with a reference, to produce a square wave output, which may be used as a Pclock or other clock signal.

In a preferred embodiment, the Hsync signal and an incoming clock are coupled to a sequence of modules. Each module comprises a latch for sampling the incoming clock on a transition of the Hsync signal, whose output is combined (using an XOR gate) with the Hsync signal. Each module comprises a time delay for generating a delayed clock signal, incrementally delayed from the previous module in the sequence, so that the clock signal for each module is phase-offset from all other modules. The latch outputs are summed using a resistor network, to produce a triangle-shaped waveform which is phase locked to the Hsync signal and which is frequency locked to the incoming clock. The triangle-shaped waveform is compared with a constant voltage to produce a square wave.

DESCRIPTION OF THE PREFERRED EMBODIMENT

Figure 1:
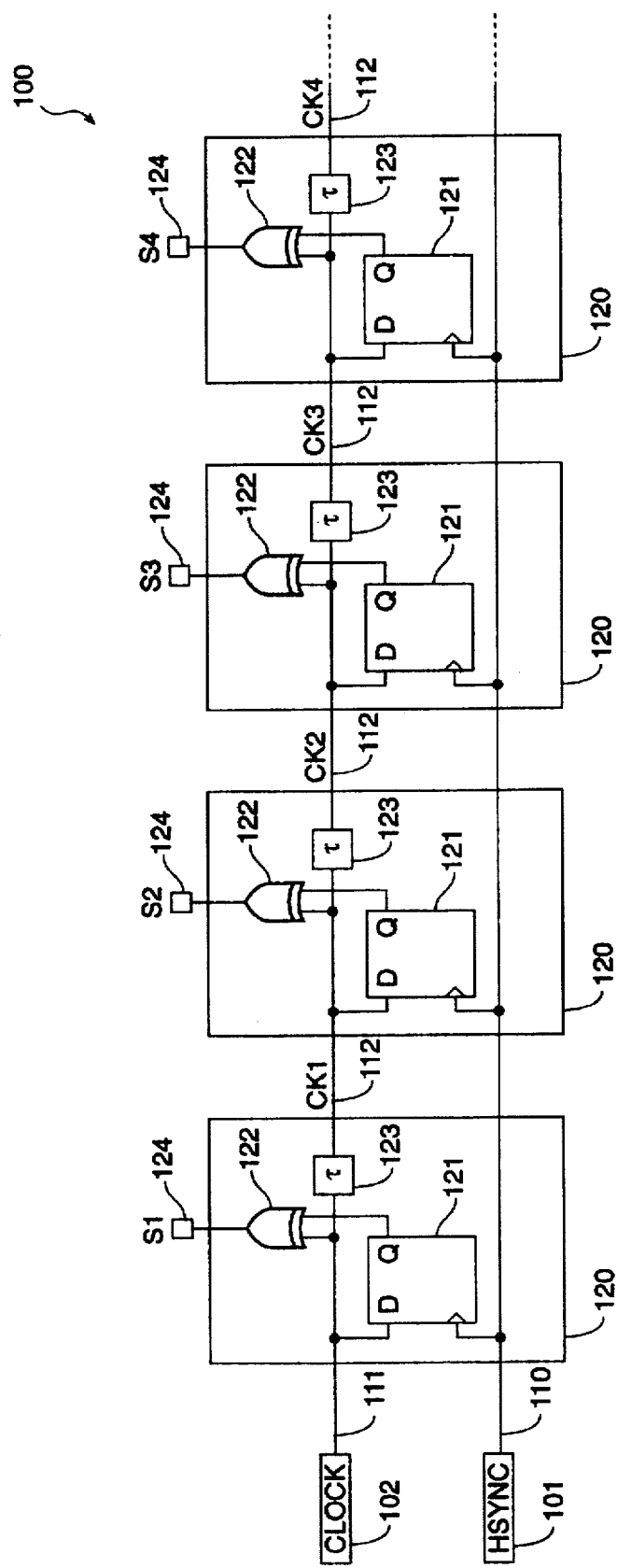
FIG. 1 shows a first part of a circuit for synchronizing to an incoming Hsync signal and for generating a phase locked high frequency signal in response thereto.

FIG. 1 shows a first part of a circuit for synchronizing to an incoming Hsync signal and for generating a phase locked high frequency signal in response thereto.

A circuit 100 comprises a first input node 101 for receiving an incoming signal and a second input node 102 for receiving an incoming clock.

In a preferred embodiment, the incoming signal at the node 101 comprises a horizontal sync (Hsync) signal for a video signal, and has a frequency range of from about 31.5 KHz to about 70 KHz, depending on the nature of the video board and the screen resolution. In alternative embodiments, the incoming signal may comprise another signal with a periodic edge transition.

In a preferred embodiment, the incoming clock at the node 102 comprises a clock signal at a frequency range of between about 20 MHz to about 80 MHz, corresponding to a clock period of between about 12.5 nanoseconds and about 50 nanoseconds.

The circuit 100 comprises an output node 103 for supplying a generated clock. In a preferred embodiment, the generated clock at the node 103 is used as a pixel clock signal (Pclock) by video circuits coupled thereto.

The Hsync signal at the first node 101 is coupled to an Hsync line 110, which is coupled to a plurality of modules 120.

Each module 120 comprises a D flip-flop 121, having a D input, a clock input, and a Q output. The D flip-flop 121 operates to store a single data bit appearing at its D input when an edge transition occurs at its clock input, and to present that data bit at its Q output at all times. D flip-flops are known in the art of digital circuit design.

Each module 120 comprises an XOR gate 122, having a first input, a second input, and an output. The XOR gate 122 computes the logical "exclusive OR" of its two inputs. XOR gates are known in the art of digital circuit design.

Each module 120 comprises a time delay 123, having an input and an output. The time delay 123 presents the signal appearing at its input, after a time delay, as an identical signal at its output. Time delay elements are known in the art of digital circuit design.

The Hsync line 110 is coupled to each module 120 at the clock input of its D flip-flop 121.

The incoming clock at the second node 102 is coupled to a CLOCK line 111, which is also coupled to the plurality of modules 120, but is subjected to an incremental time delay at each successive module 120.

The (undelayed) CLOCK line 111 is coupled to a first module 120 at the D input for the D flip-flop 121, at the first input for the XOR gate 122, and at the input for the time delay 123. The output of the time delay 123 for the first module 120 provides a delayed clock, which is the incoming clock delayed by one unit τ (tau) of time delay, on a delayed clock line 112.

The delayed clock line 112 (the incoming clock delayed by τ, labeled CK1), is coupled to the second module 120 in like manner as the CLOCK line 111 is coupled to the first module 120. Similarly, a second delayed clock line 112 (the incoming clock delayed by 2τ, labeled CK2), is coupled to the third module 120, and so on, so that in general the incoming clock, delayed by Nτ, where N is an integer, is coupled using an Nth delayed clock line 112 to the (N+1)st module 120.

Within each module 120, the Q output of the D flip-flop 121 is coupled to the second input of the XOR gate 122. The output of the XOR gate 122 is coupled to a node 124, labeled S1, S2, and so on, respectively for each module 120, thus generating one output bit per module 120.

In a preferred embodiment, there are typically eight modules 120, and each time unit τ typically comprises 3 nanoseconds. However, in alternative embodiments, different values of the time unit τ may be used.

Figure 2:
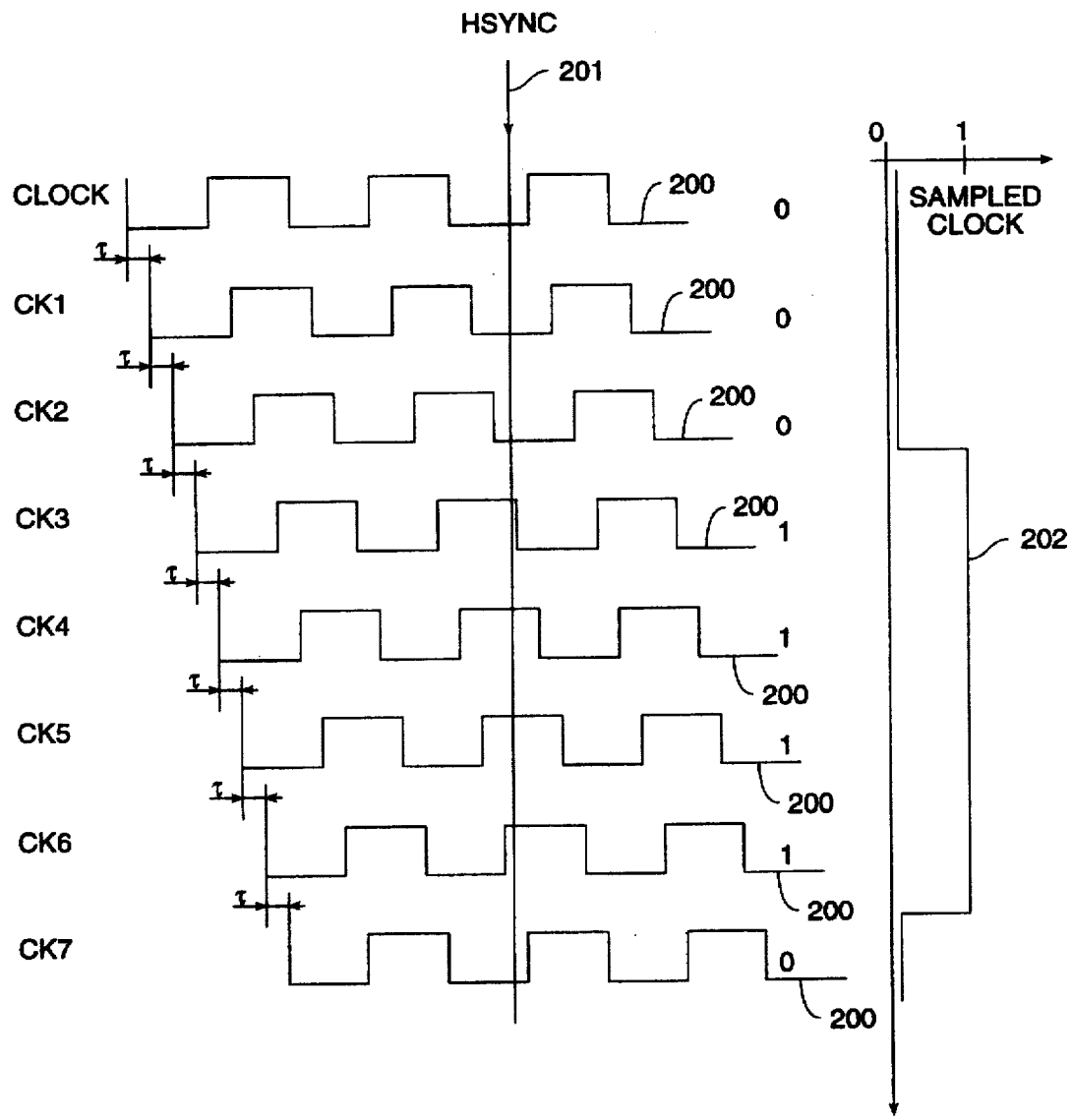
FIG. 2 shows a timing diagram of signals synchronized to an incoming clock.

FIG. 2 shows a timing diagram of signals synchronized to an incoming clock.

The clock signal 200 on the CLOCK line 111 is shown in parallel with the clock signals 200 on the delayed clock lines 112. Each clock signal 200 is incrementally delayed by one time unit τ for each module 120. Thus, CK1 is delayed by τ, CK2 is delayed by 2τ, and so on, up to CK7 in a embodiment having eight modules 120, which is delayed by 7τ.

A transition 201 represents a time of transition from logic "1" to logic "0" for an Hsync signal on the Hsync line 110. Due to the incremental delays, some of the clock signals 200 are logic "0" at the transition 201, while others of the clock signals 200 are logic "1" at the transition 201.

The Hsync signal on the Hsync line 110 clocks the D flip-flop 121 for each of the modules 120, causing the D flip-flop 121 to sample the value of its corresponding clock signal 200, and causing the Q output of each D flip-flop 121 to take on that value. A sampled clock waveform 202 shows the sampled value for each D flip-flop 121 at the transition 201.

In those modules 120 where the sampled value is logic "0", the output of the XOR gate 122 (and thus the logic value at the node 124) will be equal to its corresponding clock signal 200, while in those modules 120 where the sampled value is logic "1", the output of the XOR gate 122 will be the inverse of its corresponding clock signal 200.

Figure 3:
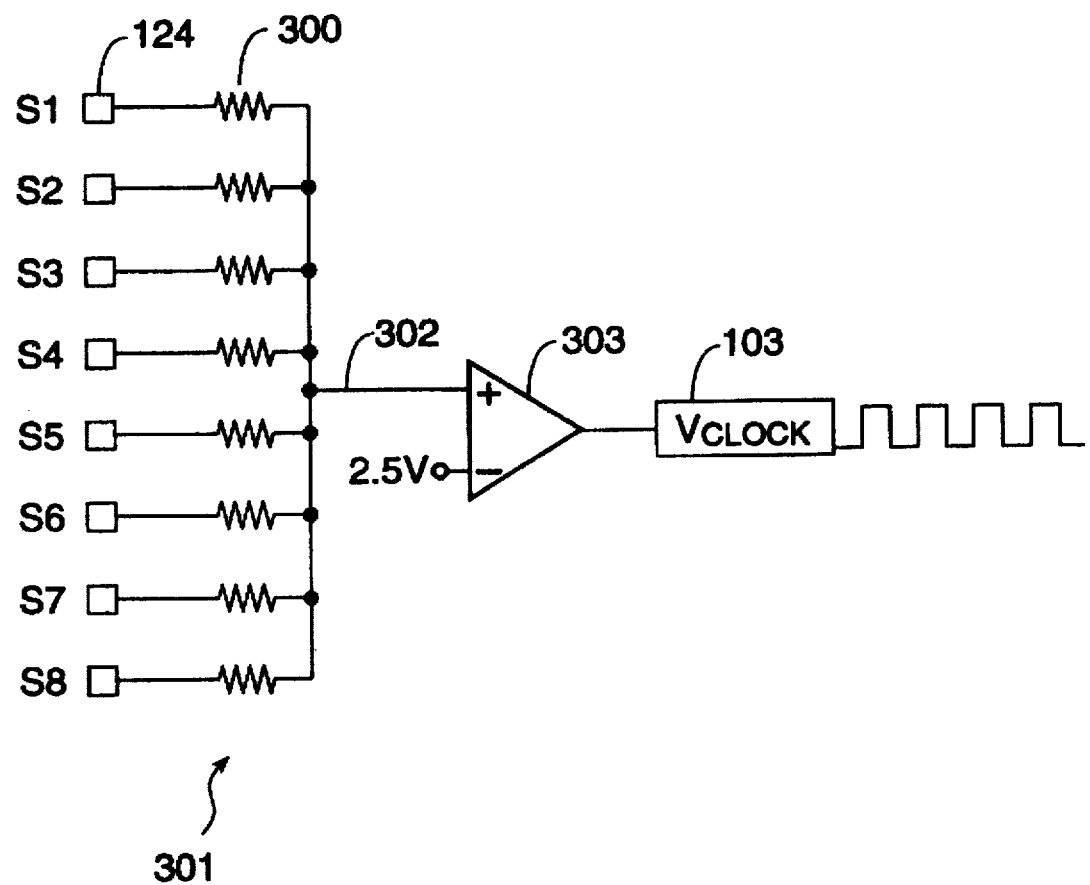
FIG. 3 shows a second part of a circuit for synchronizing to an incoming Hsync signal and for generating a phase locked high frequency signal in response thereto.

FIG. 3 shows a second part of a circuit for synchronizing to an incoming Hsync signal and for generating a phase locked high frequency signal in response thereto.

Each node 124 (also shown in FIG. 1) is coupled to a resistor 300 in a resistor network 301. The resistors 300 all have equal resistance value and are all coupled to a summing node 302, so as to generate a signal at the summing node 302 which is the analog sum of the signals at the nodes 124.

In alternative embodiments, the resistors 300 may have differing values, so as to generate a signal which is a weighted sum. Alternatively, another circuit for summing or another technique for summing may be used.

The summing node 302 is coupled to a comparator 303 at a positive input. The comparator 303 comprises a negative input, which is coupled to a reference, preferably a constant 2.5 volts for the CMDS logic family. The comparator 303 also comprises an output, which is coupled to the output node 103 for supplying the generated clock.

In alternative embodiments, another reference may be used, such as another reference voltage for another logic family or another reference voltage for the CMDS logic family.

Figure 4:
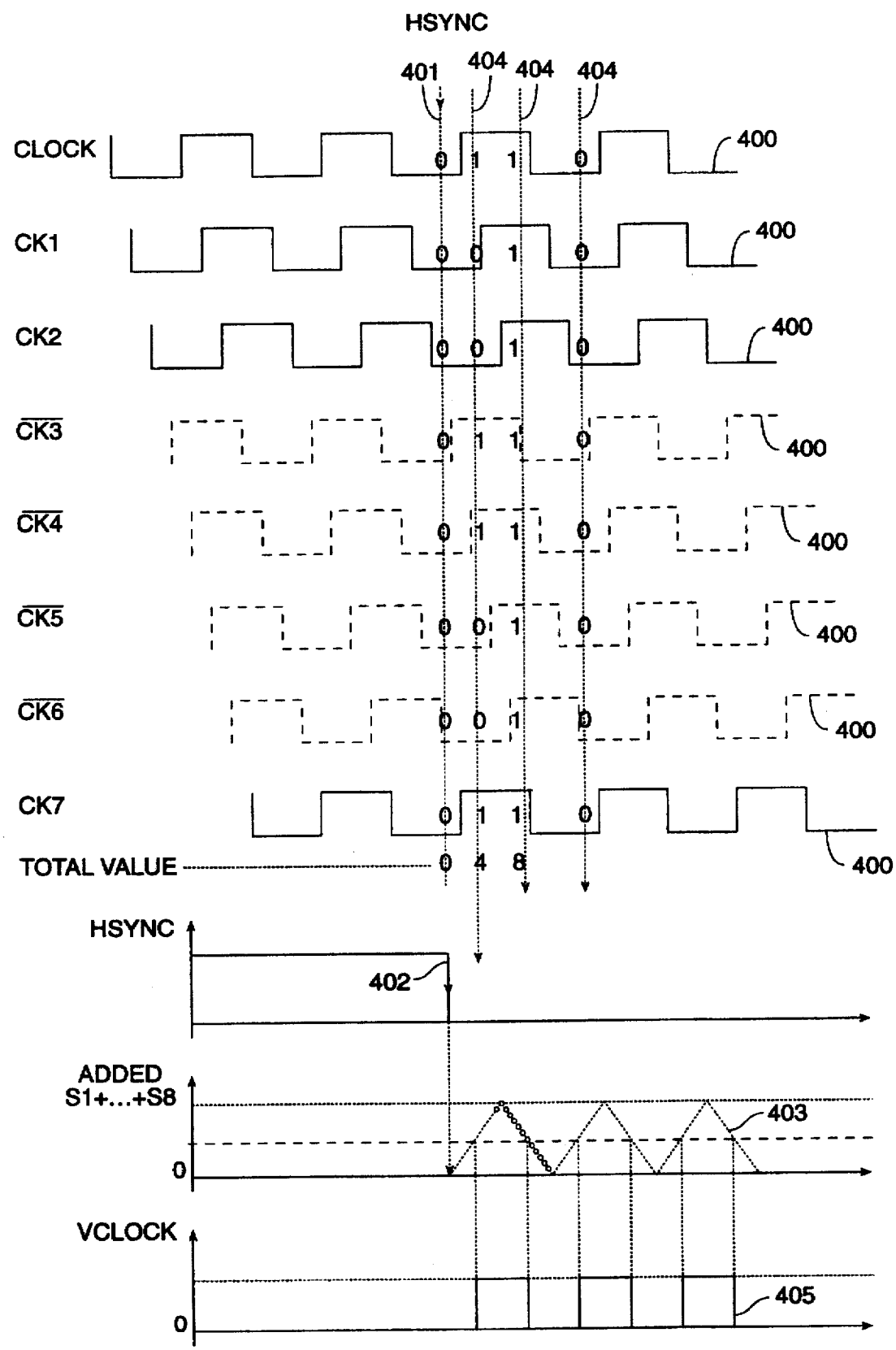
FIG. 4 shows a timing diagram of signals synchronized to the incoming Hsync signal.

FIG. 4 shows a timing diagram of signals synchronized to the incoming Hsync signal.

Output signals 400 at the nodes 124 are shown in parallel, each corresponding either to one of the clock signals 200 (CLOCK, CK1, CK2 and CK7) or to one of the clock signals 200 inverted (CK3 inverted, CK4 inverted, CK5 inverted, CK6 inverted).

A transition line 401 for the Hsync signal on the Hsync line 110 is shown corresponding to an edge transition 402 for the Hsync signal. A sum signal 403 is generated at the summing node 302; this sum signal 403 is always zero at the transition 401.

As time passes, the output signals 400 change with changes in the clock signals 200. A sequence of lines 404 is shown corresponding to later times following the edge transition 402 for the Hsync signal. The sum signal 403 is continuously generated at the summing node 302; the sum signal 403 rises and falls in a triangle-shaped waveform with changes in the clock signals 200, with a period equal to the period of the clock signals 200.

A generated clock signal 405 is generated at the output node 103, in response to the sum signal 403 at the summing node 302, using the comparator 303. The generated clock signal 405 is a square wave.

Because the generated clock signal 405 is always zero at the edge transition 402 for the Hsync signal, it is synchronized to the incoming signal at the node 101. Because the generated clock signal 405 is responsive to the sum signal 403, it has a frequency equal to the incoming clock at the node 102.

In addition to the generated clock signal 405, a delayed Hsync signal is generated which is synchronized with the generated clock signal 405 and which skips the first new period of the generated clock signal 405, so as to avoid any transition between generated clock signals 405 for successive Hsync pulses.

In a preferred embodiment, the total delay Kτ, where K is the number of modules 120, must be greater than one-half of the period of the input clock at node 102, to be able to sample the input clock.

The generated clock signal 405 may have a phase shift at each transition 402, and the amount of this phase shift depends on the value of the unit time delay τ, the number of modules 120, and on the input clock frequency. For eight modules 120, the phase shift will be no more than τ in the worst case (when the input clock has a period exactly equal to 2τ).

Alternative Embodiments

Although preferred embodiments are disclosed herein, many variations are possible which remain within the concept, scope, and spirit of the invention, and these variations would become clear to those skilled in the art after perusal of this application.

We claim:

1. A circuit for generating an output signal synchronized to an incoming periodic signal, said circuit comprising:

a first node disposed for coupling to said incoming periodic signal;

a second node disposed for coupling to an incoming clock;

a sequence of modules, each said module comprising a latch, an XOR gate, and a time delay, wherein an output of said latch is coupled to said XOR gate;

wherein said first node is coupled to a clock input of each said latch;

wherein said second node is coupled to an input of said latch and an input of said time delay of a first said module, and wherein an output of said time delay of each said module is coupled to an input of said latch of a next said module and an input of said time delay of a next said module; and a summing node coupled to an output of said XOR gate of each said module.

2. A circuit as in claim 1, wherein a product of said time delay and a number of said modules is greater than half of a period of said incoming clock.

3. A circuit as in claim 1, comprising a comparator having a first input coupled to said summing node and a second input coupled to a predetermined signal.

4. A circuit, comprising:
means for receiving an incoming signal;
means for sampling a set of parallel clock signals;
means for combining an output of said means for sampling with said parallel clock signals;
means for summing an output of said means for combining; and
means for shaping an output of said means for summing wherein said means for shaping comprises a comparator and a reference signal.

5. A circuit as in claim 4, wherein said means for sampling comprises at least one latch.

6. A circuit as in claim 4, wherein said means for combining comprises a logic gate.

7. A circuit as in claim 4, wherein said means for summing comprises a summing node.

8. A circuit as in claim 4, comprising means for generating said set of parallel clock signals in response to an incoming clock signal.

9. A circuit as in claim 8, wherein said means for generating comprises at least one time delay.

10. A circuit for generating an output signal synchronized to an incoming signal, said circuit comprising:
means for sampling a plurality of clock signals at a transition of said incoming signal, to provide corresponding sample bits;
first means for combining said clock signals with said corresponding sample bits, to provide altered clock signals; and
second means for combining said altered clock signals into an output signal comprising means for comparing a sum of said altered clock signals with a reference signal.

11. A circuit as in claim 10, wherein said means for sampling comprises:
means for coupling at least one said clock signal to a latch; and
means for triggering said latch responsive to said incoming signal.

12. A circuit as in claim 10, wherein said first means for combining comprises:
means for coupling at least one said clock signal to a logic gate; and
means for coupling at least one said corresponding sample bit to said logic gate.

13. A circuit as in claim 10, wherein said first means for combining comprises means for inverting at least one said clock signal responsive to said corresponding sample bit.

14. A circuit as in claim 10, wherein said second means for combining further comprises means for summing said altered clock signals.

15. A circuit as in claim 10, wherein said second means for combining further comprises means for forming a square wave responsive to said altered clock signals.

16. A circuit as in claim 10, comprising means for providing said plurality of clock signals, said means for providing comprising:

means for receiving an incoming clock signal;
means for generating at least one time-delayed version of said incoming clock signal.

17. A circuit for generating an output signal synchronized to an incoming signal, said circuit comprising:
a node disposed for coupling to said incoming signal;
a plurality of latches, each said latch coupled to one of a plurality of clock signals and having a triggering input coupled to said node;
a plurality of logic gates, each said logic gate coupled to one of said clock signals and to one of said latches, and each said logic gate having an logic output;
an output node coupled to all of said logic outputs; and
a summing node coupled to all of said logic outputs; and
a comparator coupled to said summing node, to a reference signal, and to said output node.

18. A circuit for generating an output signal synchronized to an incoming signal, said circuit comprising:
a plurality of modules each having a latch triggered by said incoming signal, a time delay, and an XOR gate;
wherein said time delay of each said module is coupled to said time delay of a previous said module and to said latch of a next said module;
wherein said XOR gate of each said module is coupled to said latch of said module and to said time delay of said previous module; and
a summing node coupled to each said latch.

19. A circuit as in claim 18, comprising a comparator coupled to said summing node and to a reference signal.

20. A circuit as in claim 18, wherein said time delay of a first said module is coupled to an incoming clock.

21. A method for generating an output signal synchronized to an incoming signal, said method comprising:
sampling a plurality of clock signals at a transition of said incoming signal, to provide corresponding sample bits;
combining said clock signals with said corresponding sample bits, to provide altered clock signals; and
combining said altered clock signals into an output signal wherein said second step of combining comprises comparing a sum of said altered clock signals with a reference signal.

22. A method as in claim 21, wherein said step of sampling comprises:
coupling at least one said clock signal to a latch; and
triggering said latch responsive to said incoming signal.

23. A method as in claim 21, wherein said first step of combining comprises:
coupling at least one said clock signal to a logic gate; and
coupling at least one said corresponding sample bit to said logic gate.

24. A method as in claim 21, wherein said first step of combining comprises inverting at least one said clock signal responsive to said corresponding sample bit.

25. A method as in claim 21, wherein said second step of combining further comprises summing said altered clock signals.

26. A method as in claim 21, wherein said second step of combining further comprises forming a square wave responsive to said altered clock signals.

27. A method as in claim 21, comprising the step of providing a plurality of clock signals, said step comprising:
receiving an incoming clock signal;
generating at least one time-delayed version of said incoming clock signal.

* * * * *